United States Patent
Chen et al.

(10) Patent No.: US 10,229,827 B2
(45) Date of Patent: Mar. 12, 2019

(54) METHOD OF REDISTRIBUTION LAYER FORMATION FOR ADVANCED PACKAGING APPLICATIONS

(71) Applicant: Applied Materials, Inc., Santa Clara, CA (US)

(72) Inventors: Han-Wen Chen, Cupertino, CA (US); Steven Verhaverbeke, San Francisco, CA (US); Roman Gouk, San Jose, CA (US); Guan Huei See, Singapore (SG); Yu Gu, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/844,989

(22) Filed: Dec. 18, 2017

(65) Prior Publication Data

US 2018/0374696 A1    Dec. 27, 2018

Related U.S. Application Data

(60) Provisional application No. 62/524,298, filed on Jun. 23, 2017.

(51) Int. Cl.
| | | |
|---|---|---|
| *H01L 21/31* | (2006.01) | |
| *H01L 21/02* | (2006.01) | |
| *H01L 23/538* | (2006.01) | |
| *H01L 21/48* | (2006.01) | |
| *H01L 21/311* | (2006.01) | |

(Continued)

(52) U.S. Cl.
CPC ...... *H01L 21/02107* (2013.01); *G03F 7/0002* (2013.01); *H01L 21/0274* (2013.01); *H01L 21/311* (2013.01); *H01L 21/4825* (2013.01); *H01L 23/5389* (2013.01)

(58) Field of Classification Search
CPC .......................... H01L 21/02107; G03F 7/0002
USPC .......................................................... 438/781
See application file for complete search history.

(56) References Cited

U.S. PATENT DOCUMENTS

4,654,379 A * 3/1987 Lapin .................... C08F 251/00
                                                         522/15
5,260,349 A * 11/1993 Crivello ............... C08G 59/306
                                                        522/170

(Continued)

FOREIGN PATENT DOCUMENTS

| CN | 105206592 A | 12/2015 |
| KR | 1020120055748 A | 6/2012 |
| WO | 2017045423 A1 | 3/2017 |

OTHER PUBLICATIONS

PCT International Search Report and Written Opinion dated Sep. 28, 2018, for International Application No. PCT/US2018/036298.

*Primary Examiner* — Nitin Parekh
(74) *Attorney, Agent, or Firm* — Patterson + Sheridan LLP

(57) ABSTRACT

Embodiments of the present disclosure generally describe methods of forming one or more device terminal redistribution layers using imprint lithography. The methods disclosed herein enable the formation of high aspect ratio interconnect structures at lower costs than conventional photolithography and etch processes. Further, the processes and methods described herein desirably remove, reduce, and/or substantially eliminate voids in the surrounding polymer layer formed during the polymer deposition process or subsequent thereto.

13 Claims, 7 Drawing Sheets

(51) Int. Cl.
*G03F 7/00* (2006.01)
*H01L 21/027* (2006.01)

(56) References Cited

U.S. PATENT DOCUMENTS

| | | | | |
|---|---|---|---|---|
| 5,512,131 | A * | 4/1996 | Kumar | B05D 1/283 |
| | | | | 216/13 |
| 6,069,259 | A * | 5/2000 | Crivello | C07F 7/0852 |
| | | | | 528/27 |
| 6,818,475 | B2 * | 11/2004 | Yang | H01L 23/3114 |
| | | | | 257/E21.508 |
| 7,098,061 | B2 * | 8/2006 | Sirringhaus | B82Y 30/00 |
| | | | | 257/E21.255 |
| 7,828,984 | B2 * | 11/2010 | Seki | B82Y 10/00 |
| | | | | 216/41 |
| 8,288,210 | B2 | 10/2012 | Lee et al. | |
| 9,034,429 | B2 * | 5/2015 | Bryan-Brown | B82Y 10/00 |
| | | | | 427/258 |
| 9,263,649 | B2 * | 2/2016 | Koike | G03F 7/0002 |
| 9,399,693 | B2 * | 7/2016 | Hayashida | B82Y 10/00 |
| 2005/0106855 | A1 | 5/2005 | Farnworth | |
| 2008/0000373 | A1 * | 1/2008 | Petrucci-Samija | |
| | | | | B29C 35/0888 |
| | | | | 101/401.1 |
| 2008/0113283 | A1 | 5/2008 | Ghoshal et al. | |
| 2013/0203190 | A1 | 8/2013 | Reed et al. | |
| 2017/0110413 | A1 | 4/2017 | Chen et al. | |

\* cited by examiner

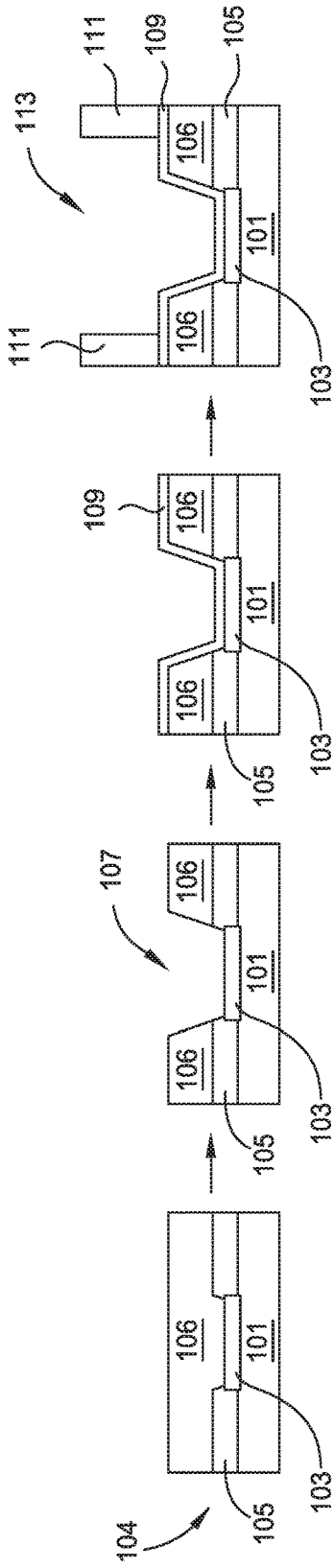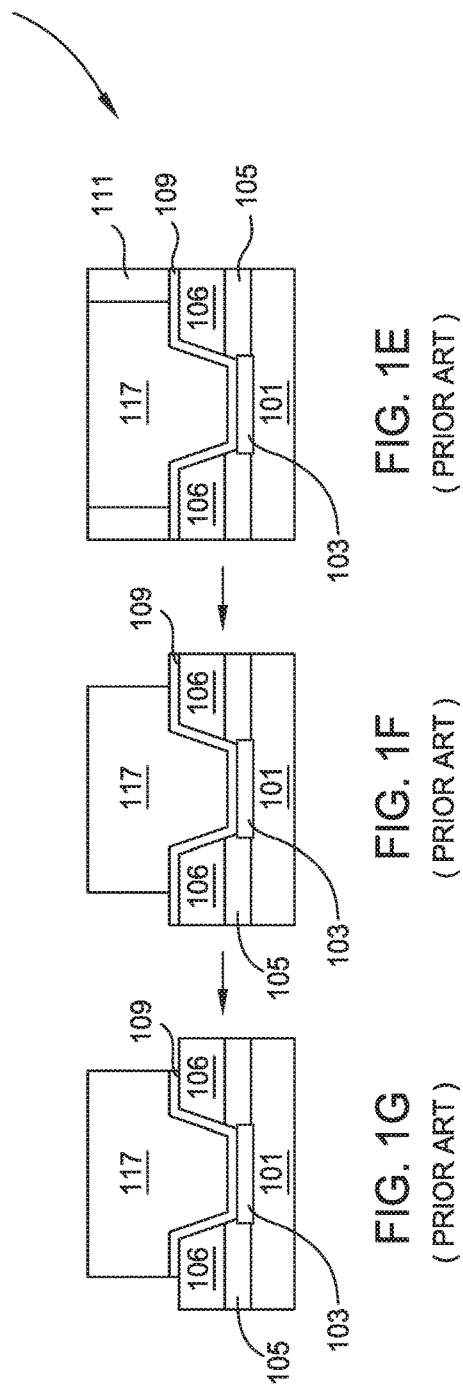

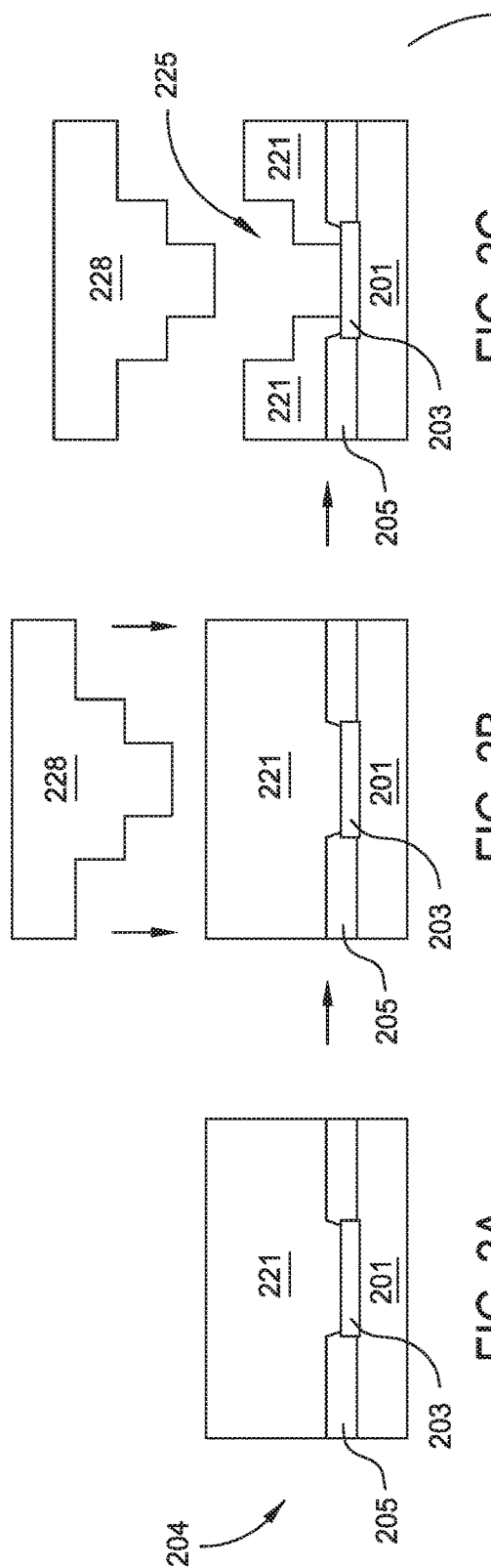

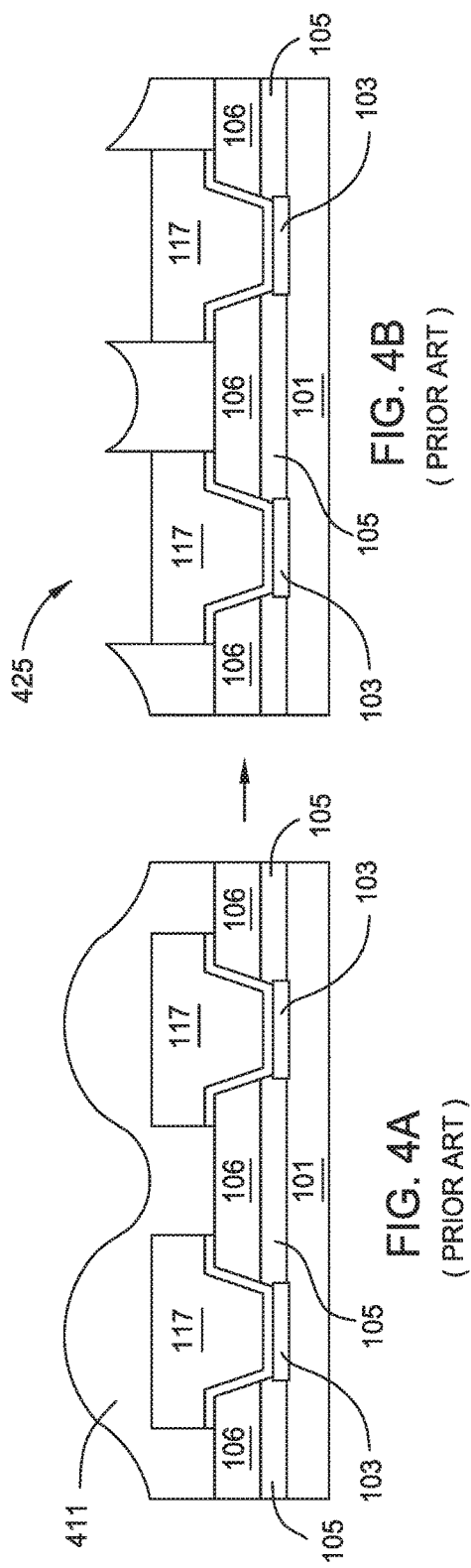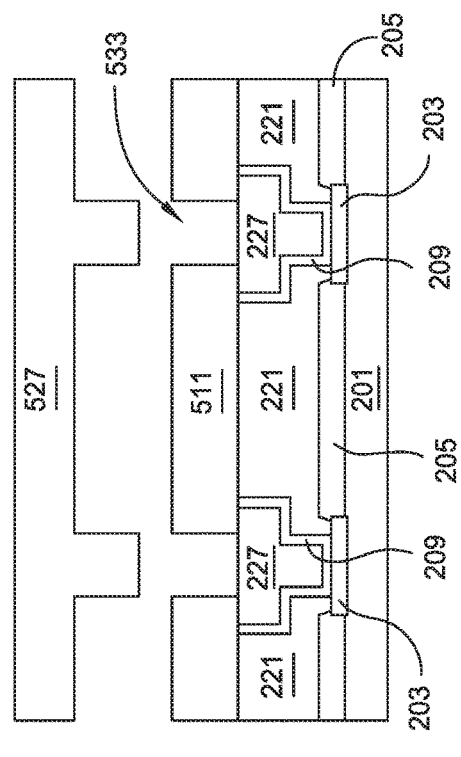

METHOD OF REDISTRIBUTION LAYER FORMATION FOR ADVANCED PACKAGING APPLICATIONS

CROSS-REFERENCE TO RELATED APPLICATIONS

This application claims priority to U.S. Provisional Application Ser. No. 62/524,298, filed on Jun. 23, 2017, which is herein incorporated by reference in its entirety.

BACKGROUND

Field

Embodiments described herein generally relate to the field of semiconductors, and more specifically, to methods of packaging semiconductor devices.

Description of the Related Art

As circuit densities increase and device sizes decrease for next generation semiconductor devices, providing the external connections, i.e., wiring, to these devices requires advanced packaging technologies. One such packaging technology is wafer level packaging.

Wafer level packaging streamlines the manufacturing and packaging processes of semiconductor devices by integrating device manufacturing, package assembly (packaging), electrical testing, and reliability testing (burn-in) at the wafer level, where forming of the top and bottom layers of the packaging, creating the I/O connections, and testing the packaged device are all performed before the devices are singulated into individual packaged components. The advantages of wafer level packaging include reduced overall manufacturing costs of the resulting device, reduced package size, and improved electrical and thermal performance. However, typical wafer level packaging schemes limit the number of I/O connections that can be made to the semiconductor device to the number of I/O terminals that can be spread over the surface of the die. Fan-out wafer level packaging retains the advantages of wafer level packaging while increasing the area available for I/O terminals by redistributing the I/O terminals to areas exterior of the surface of the die, using one or more redistribution layers.

Fan-out wafer level packaging processes require that the surface area of the I/O terminal redistribution layer for each individual die be larger than the surface area of the individual die itself. However, because it is desirable to maximize the number of devices (dies) on a wafer in order to minimize costs during manufacturing of the device, the spaces between individual devices (dice lines) are usually only large enough to accommodate the width of the dicing saw used to dice the wafer into its individual dies. One method of creating the desired additional surface area external of the die surface is to form a new wafer with dies redistributed in a spaced apart pattern, known as a reconstituted substrate.

Typically, to form a reconstituted substrate a wafer is singulated into individual die which are then positioned on a molding plate (carrier substrate) spaced apart from one another and temporarily secured thereto by an adhesion layer. A molding compound is dispensed onto the carrier substrate and the dies secured thereto and subsequently cured, which embeds the spaced apart dies in the molding compound to form the reconstituted substrate. The terminal sides of the dies are then exposed by removing the adhesion layer, and redistribution layers, having interconnects disposed therein, are subsequently formed on the reconstituted substrate, to redistribute a portion, or all, of the device's I/O terminals to areas exterior of the surface of the die, which increases the area available for I/O connections and thus the number of possible I/O terminals.

Process defects associated with forming the reconstituted substrate, such as undesirable repositioning of the dies within the reconstituted substrate from their original placement location on the adhesion layer, also known as die shift, cause misalignment between the via interconnects in the subsequently formed redistribution layer and the electrical contacts on the dies. Additionally, the redistribution layers are typically formed using conventional photolithography and etch processes which are costly, equipment intensive, and time consuming.

Accordingly, there is a need in the art for improved methods of forming reconstituted substrates, and redistribution layers disposed thereon, for fan-out wafer level packaging schemes.

SUMMARY

Embodiments herein generally relate to device packaging processes, and in particular, relate to methods of forming redistribution layers on a reconstituted substrate in a fan-out wafer level packaging process.

In one embodiment, a method for forming a redistribution layer is provided. The method includes depositing a polymer onto a surface of a reconstituted substrate, the reconstituted substrate comprising a plurality of devices disposed in a molding compound, heating the polymer to between about 120° C. and about 150° C., imprinting a pattern into the polymer to form a plurality of openings therein, and heating the polymer to between about 250° C. and about 400° C. after imprinting the pattern.

In another embodiment, a packaging method is provided. The method includes depositing a polymer onto a first surface of a carrier substrate, imprinting a pattern into the polymer to form a polymer layer with a plurality of openings therethrough, and forming a plurality of metal interconnects disposed in the polymer layer. Herein, forming the plurality of metal interconnects comprises depositing a seed layer onto the carrier substrate and the polymer layer formed thereon, forming a copper layer on the seed layer, and removing portions of the seed layer and the copper layer from a second surface of the polymer layer.

In another embodiment, another packaging method is provided. The packaging method comprises depositing a polyimide onto a substrate, heating the polyimide to between about 120° C. and about 150° C., imprinting the polyimide to form a dielectric layer with a plurality of openings therethrough, and heating the dielectric layer to between about 250° C. and about 400° C. after imprinting the polyimide.

In another embodiment, a method of forming a redistribution layer using a micro-imprint lithography (MIL) process is provided. In the method, a polymer layer, such as a non-photosensitive polyimide, is dispensed onto a substrate, such as a reconstituted substrate, a MIL stamp is used to form openings in the polymer layer, and metal interconnects are formed in the openings using an electroplating and planarization process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A-1G illustrate the formation of a redistribution layer interconnect using a conventional photolithography process, according to the prior art.

FIGS. 2A-2F illustrate the formation of one or more redistribution layers according to the method described in FIG. 3.

FIGS. 4A-4B illustrate the formation of a second redistribution layer, according to the prior art.

FIGS. 5A-5B illustrate the formation of a second redistribution layer according to embodiments disclosed herein.

DETAILED DESCRIPTION

Figure 3:
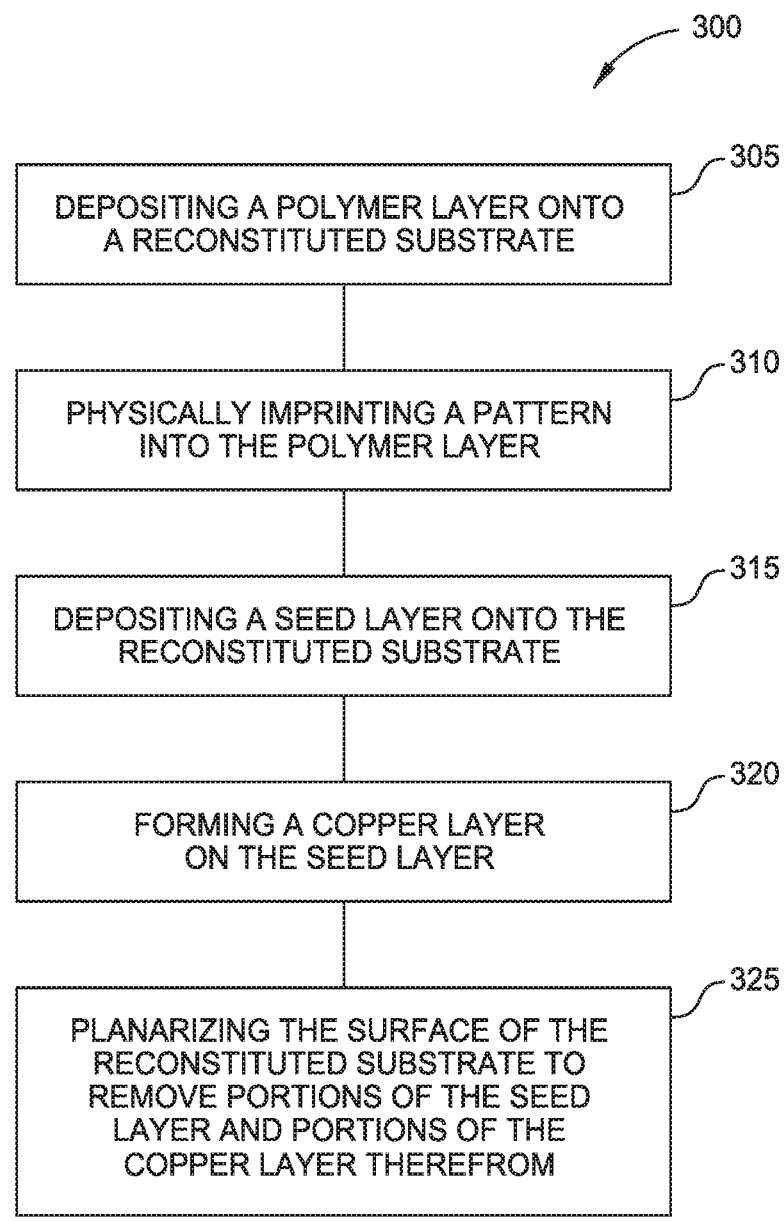
FIG. 3 is a flow diagram illustrating a method of forming a redistribution layer, according to embodiments disclosed herein.

Embodiments of the present disclosure generally describe methods of forming one or more device terminal redistribution layers using imprint lithography.

Conventionally, redistribution layers of a fan-out wafer level packaging scheme are formed using time consuming and expensive photolithography and etch processes, such as the process illustrated in FIGS. 1A-1G.

FIGS. 1A-1G illustrate the formation of a redistribution layer interconnect using a conventional photolithography process, according to the prior art. FIGS. 1A-1G show a portion of a single device 104 which is embedded in a reconstituted substrate (not shown). As shown in FIG. 1A, a dielectric layer 106, such as a photo-sensitive polymer, is deposited onto the reconstituted substrate and the device 104 embedded therein, the device 104 includes an active portion 101 having a metal layer and a passivation layer 105 disposed thereon. Typically, an opening is formed in the passivation layer 105 to expose a contact pad 103 of the metal layer therebeneath. A via opening 107, shown in FIG. 1B, is then formed in the dielectric layer 106 using conventional photolithography and etch processes where a pattern is exposed onto the photosensitive polymer which is then etched to form the via opening 107. Once the via opening 107 is formed, a seed layer 109, as shown in FIG. 1C, is deposited onto the reconstituted substrate, and the features formed thereon, to facilitate electroplating of a subsequently deposited metal layer. To form a via and wire interconnect structure a photoresist layer 111 is deposited to coat the reconstituted substrate, and the features disposed thereon, and a trench opening 113, as shown in FIG. 1D, is formed therein by additional photolithography and etch processes. Copper is then formed in the trench opening 113 using an electroplating process to form an interconnect structure 117 before the photoresist layer 111 is removed exposing portions of the seed layer 109 therebeneath, as shown in FIGS. 1E-1F. The exposed portions of the seed layer 109 are then removed, as shown in FIG. 1G, using an etch process. The photolithography and etch processes used to form the via and trench openings 107 and 113 described above involve multiple operations on multiple pieces of equipment which makes formation of the redistribution layer, a low throughput, high cost, and labor and equipment intensive process. In contrast, the micro-imprint lithography methods described herein have substantially fewer process operations thus enabling a high throughput packaging process at a significant cost reduction. Further, the micro-imprinting processes described herein may be used to form higher aspect ratio openings in thicker dielectric polymer layers when compared to a conventional photolithography process which is restricted by photo-development capability and throughput considerations.

FIGS. 2A-2F illustrate the formation of one or more redistribution layers, according to the method described in FIG. 3. FIG. 3 is a flow diagram illustrating a method of forming a redistribution layer, according to embodiments disclosed herein. The method 300 begins at activity 305 with depositing a polymer layer 221, such as a dielectric polymer layer, such as a polyimide layer, onto a surface of a reconstituted substrate (not shown). Herein, the polymer layer 221 is deposited using a spin coating and soft bake method where a polyimide precursor is dispensed onto a rotating reconstituted substrate until a uniform layer of the polyimide precursor is formed thereon. The reconstituted substrate and the polyimide precursor disposed thereon are heated to between about 120° C. and about 150° C. (soft baked) to remove only a portion of the solvents contained in the polyimide precursor making the polymer layer 221 suitable for subsequent imprinting. FIG. 2A shows a portion of a device 204 embedded in a reconstituted substrate (not shown) having the polymer layer 221 disposed thereon. The device 204 includes an active portion 201 having a metal layer and a passivation layer 205 disposed thereon and an opening formed in the passivation layer 205 to expose a contact pad 203 of the metal layer therebeneath.

The method 300 continues at activity 310 with physically imprinting a pattern into the polymer layer 221 using a micro-imprint lithography (MIL) stamp, such as the MIL stamp 228 shown in FIG. 2B. In this embodiment, activity 310 comprises a thermal imprint process where the MIL stamp 228 is heated and the polymer layer 221 comprises a non-photosensitive polyimide. In other embodiments, activity 310 comprises a UV MIL process where the polymer layer 221 comprises a photosensitive polyimide.

Herein, the MIL stamp 228 includes an interconnect pattern used in forming a fanned out redistribution layer over one or more individual die of the reconstituted substrate in a step and repeat in another area process. In other embodiments, the MIL stamp 228 includes a plurality of patterns used in forming a plurality of fanned out redistribution interconnects over a plurality of dies in a single imprint. In some embodiments, a single MIL stamp is used to form a plurality of openings in the polymer layer 221 over the entire reconstituted substrate in a single imprint. Herein, the MIL stamp 228 is heated to between about 200° C. and about 300° C. and is pressed into the polymer layer 221 which is displaced around the pattern of the MIL stamp 228. The MIL stamp 228 is subsequently cooled and removed from the polymer layer 221 leaving a trench on via opening formed therein, such as the opening 225 shown in FIG. 2C. The MIL stamp 228 is moved over another die on the reconstituted substrate and the process is repeated until openings 225 are formed in the polymer layer 221 over all desired dies on the reconstituted substrate. In embodiments using a UV MIL process, the MIL stamp 228 comprises a UV transparent material, such as quartz, and a polymer layer 221 comprising a photosensitive polyimide is exposed to UV radiation through the stamp where the UV radiation comprises about 365 nm at 200 mJ/cm$^2$. In some embodiments, activity 310 takes place in a low pressure atmosphere, such as in a processing system having a processing volume maintained at a pressure less than atmospheric pressure, such as less than one half of atmospheric pressure, or less than about 400 Torr, for example less than about 300 Torr. Physically imprinting a pattern into the polymer layer 221 using a heated MIL stamp 228 in a low pressure atmosphere desirably removes, reduces, and/or substantially eliminates voids (not shown) formed in the polymer layer 221 during and/or subsequent to the formation thereof.

After formation of the openings 225, the reconstituted substrate is thermally cured in a nitrogen environment at between about 250° C. and 400° C., such as between about 250° C. and 350° C., or between about 325° C. and 400° C., for example about 300° C. for a thermal MIL process and about 375° C. for a UV MIL process. Residual polymer on the contact pads 203 is subsequently removed using an oxygen plasma descum or other suitable method. In some embodiments, such as embodiments using a UV MIL process the oxygen plasma descum is before the thermal cure.

The method 300 continues at activity 315 with depositing a seed layer 209 over the polymer layer 221 and the openings 225 disposed therein. The seed layer 209 enables subsequent electroplating of a metal layer, herein copper, and provides a barrier to prevent diffusion of copper atoms, from the subsequently formed metal layer, into the surrounding polymer layer 221 and the contact pad 203. Herein the seed layer 209 comprises tantalum, tantalum nitride, tungsten, titanium, titanium tungsten, titanium nitride, tungsten nitride, titanium copper, or combinations thereof and is deposited using any suitable method such as chemical vapor deposition (CVD), physical vapor deposition (PVD), atomic layer deposition (ALD), or combinations thereof.

The method 300 continues at activity 320 with forming a metal layer, such as the metal layer 217 shown in FIG. 2E, on the seed layer 209 using an electroplating process. Herein, the metal layer 217 comprises copper. In other embodiments, the metal layer 217 and subsequently formed metal interconnect comprises copper, nickel, gold, antimony silver, or combinations thereof.

The method 300 ends at activity 325 with planarizing the surface of the reconstituted substrate to remove portions of the metal layer 217 and the seed layer 209 disposed on the surface of the polymer layer 221 to form one or more interconnect structures 227 in a first redistribution layer 214 as shown in FIG. 2F. Planarization of the surface of the reconstituted substrate is done using a chemical mechanical polishing (CMP) and/or a grinding process.

In addition to fewer process operations in the formation of each redistribution layer, which improves throughput and reduces manufacturing costs, the thermal MIL process described in method 300 enables the use of a non-photosensitive polyimide for the polymer layer 221 as opposed to photosensitive polymers, such as photosensitive polyimides used in a conventional photolithography and etch process. In general, among polyimide precursors suitable for use as the polymer layer 221, non-photosensitive polyimide precursors are known to have superior mechanical, electrical, and thermomechanical properties including stronger adhesion to the seed and metal layers, lower curing temperatures, less shrinkage during the curing process, and a lower dielectric constants, when compared to photosensitive polyimide precursors. Last, non-photosensitive polyimide precursors are significantly less expensive than photosensitive polyimide precursors and typically have a longer shelf life than photosensitive polyimide precursors resulting in an additional cost benefit with the thermal MIL process described herein. In addition to the benefits described above, the self-planarizing nature of the MIL methods described herein allow for formation of multiple redistribution layers without the depth of focus issues seen with increasingly uneven surface topographies inherent in the conventional photolithography and etch processes of the prior art.

FIGS. 4A-4B illustrate the formation of a second redistribution layer, according to the prior art. FIGS. 5A-5B illustrate the formation of a second redistribution layer according to embodiments described herein. As shown in FIGS. 4A-4B the topography of the deposited second polymer layer 411 inherent from the conventional photolithography and etch processes predictably results in a non-uniform second polymer layer 411 after formation of the via and/or trench opening 425. Variations in surface topography lead to misalignment problems in subsequent operations due to poor depth of focus at the photo patterning operation. Sufficient margin to compensate for these alignment problems means limiting the number of redistribution layer levels, increasing the size of the interconnect structures to ensure increased tolerances, and increasing the space between those interconnect structures to limit the number of interconnect structures, and the number of I/O terminals, in a given area. In comparison, the first redistribution layer 214 of FIG. 5A, formed according to the method 300 described in FIG. 3, has a planar surface as a result of the self-planarizing nature of the physical MIL process. The planer surface of the first redistribution layer 214 enables the uniform deposition of the polymer layer 511 over the surface of the reconstituted substrate. Also, variations in the surface topography of the polymer layer 511 are planarized by the physical MIL process, wherein an MIL stamp 527 is physically pressed into the polymer layer 511 to form the via and/or trench openings 533 therein. Herein, the MIL process used to form the via and/or trench openings 533 comprises heating the MIL stamp 527 to between about 200° C. and about 300° C. and pressing the MIL stamp 527 into the polymer layer 511. In some embodiments, the MIL process takes place in a low pressure atmosphere, such as in a processing system having a processing volume maintained at a pressure less than atmospheric pressure, such as less than one half of atmospheric pressure, or less than about 400 Torr, for example less than about 300 Torr. In other embodiments, the forming of the via and/or trench openings 533 comprises a UV MIL process, such as the UV MIL processes described herein. The planar surface topography of the distribution layers formed using the MIL methods described herein allow for an increased number of redistribution layers as well as smaller and denser interconnect structures without the alignment, and resulting yield, problems seen with a conventional photolithography and etch process. In addition, MIL processes disclosed herein enable the formation of high aspect ratio interconnect structures at lower costs than conventional photolithography and etch processes. Further, the processes and methods described herein desirably remove, reduce, and/or substantially eliminate voids in the surrounding polymer layer formed during the polymer deposition process or subsequent thereto. Higher aspect ratio via and/or wire interconnects enable reduced interconnect resistivity which improves device performance.

Figure 6A:
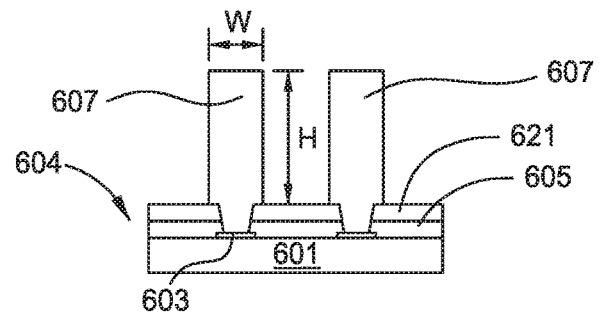
FIGS. 6A-6C illustrate the formation a high aspect ratio interconnect structure for use in a fan out wafer level packaging redistribution layer, according to embodiments described herein.
Figure 6B:
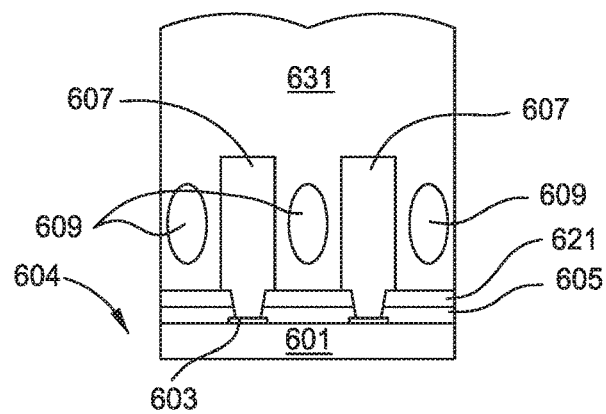
Figure 6C:
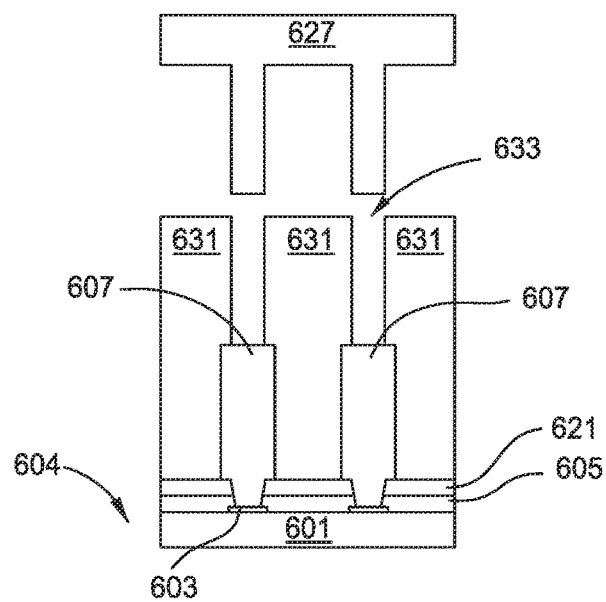

FIGS. 6A-6C illustrate the formation of a high aspect ratio interconnect structure for use in a fan out wafer level packaging redistribution layer, according to embodiments described herein. In FIGS. 6A-6C, a MIL method in a low pressure atmosphere environment is used to remove, reduce, and/or substantially eliminate undesirable voids 609 formed during deposition of a second polymer layer 631. FIG. 6A shows a plurality of copper pillars 607 disposed on a device 604, herein the device 604 is embedded in a reconstituted substrate (not shown). The device 604 includes an active portion 601 having a metal layer and a passivation layer 605 disposed thereon and a plurality of openings formed in the passivation layer 605 which expose a plurality of contact pads 603 of the metal layer therebeneath. A first polymer layer 621 is disposed on the plurality of contact pads 603 where a seed layer (not shown) is disposed between each of the copper pillars 607 and the contact pads 603. Herein, the copper pillars 607 are formed using conventional photolithography and etch processes and have an aspect ratio (H:W) of more than about 2:1, such as more than about 3:1. FIG. 6B shows a second polymer layer 631 dispensed onto and between the copper pillars 607, where the second polymer layer 631 comprises non-photosensitive polyimide precursor and is dispensed onto the substrate, and the features disposed thereon, using a spin coat method. The substrate is heated to between about 120° C. and about 150° C. (soft baked) to remove a portion of the polyimide solvents contained in the polyimide precursor which forms a soft polymer suitable for subsequent imprinting. Undesirable voids 609 formed in the second polymer layer 631 during the deposition and the soft bake thereof are removed, reduced, and/or substantially eliminated during a subsequent MIL process where an MIL stamp 627, heated to above the glass transition temperature of the polyimide precursor, such as above about 340° C., is physically pressed into the second polymer layer 631 in a low pressure atmosphere environment, such as less than atmospheric pressure, less than one half of atmospheric pressure, or less than about 400 Torr, such as less than about 300 Torr, to form high aspect ratio openings 633 therein, as shown in FIG. 6C. Physically imprinting a pattern into the second polymer layer 631 using a heated MIL stamp 627 in a low pressure atmosphere desirably removes, reduces, and/or substantially eliminates voids, such as the voids 609 shown in FIG. 6B, formed in the second polymer layer 631 during and/or subsequent to the formation thereof. Residual polymer is removed from the exposed upper surfaces of the plurality of copper pillars 607 using an oxygen plasma descum process and a second layer of copper pillars (not shown) are formed in the high aspect ratio opening 633.

Figure 7:
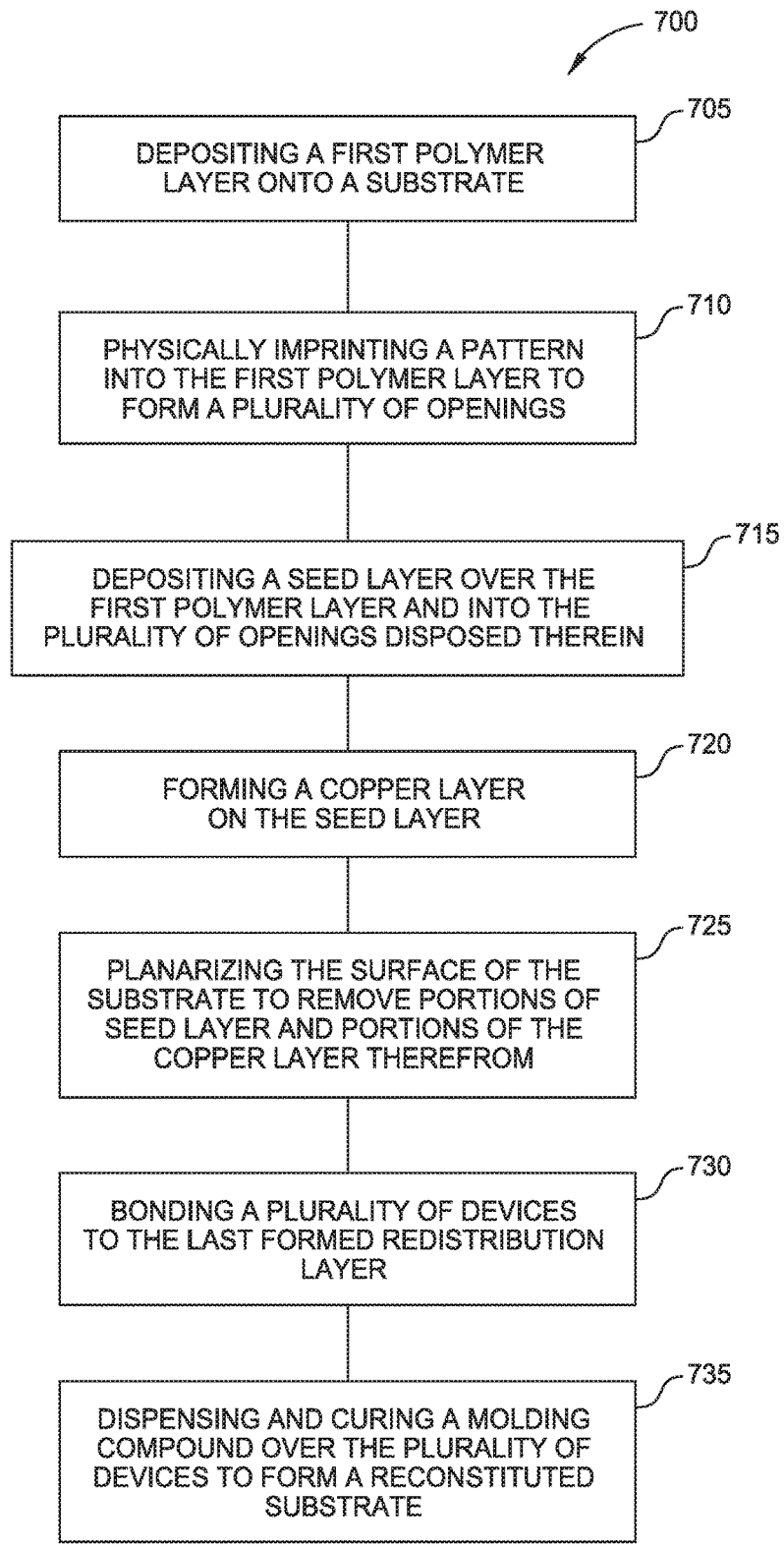
FIG. 7 is a flowchart illustrating a method of forming one or more redistribution layers in a panel fan-out packaging process, according to an alternative embodiment.
Figure 8:
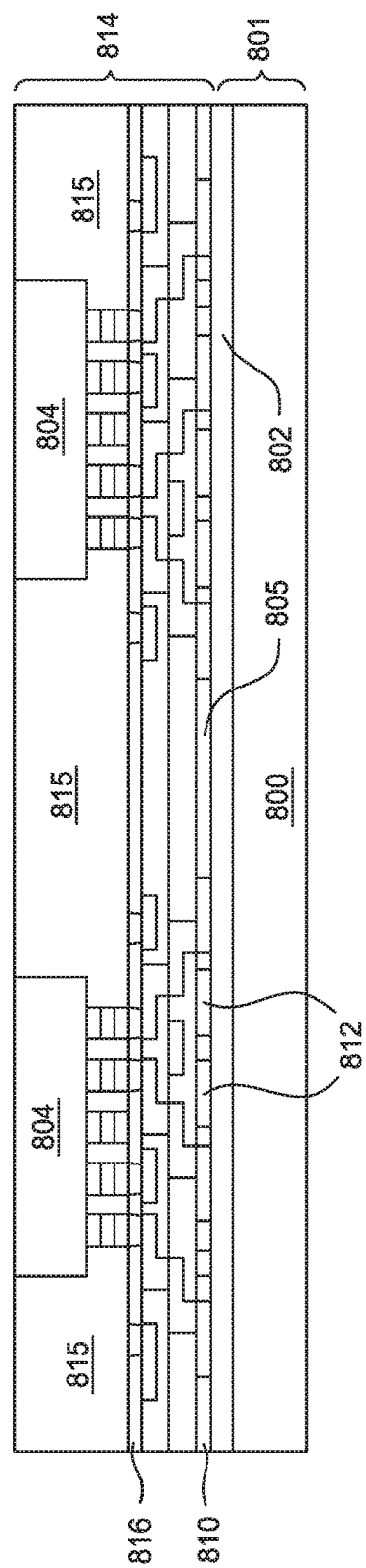
FIG. 8 is a panel having one or more redistribution layers formed thereon, according to the method described in FIG. 7.

FIG. 7 is a flowchart illustrating a method for forming one or more redistribution layers in a panel fan-out packaging process according to an alternative embodiment. FIG. 8 is a panel having one or more redistribution layers formed thereon, according to the method described in FIG. 7. The method 700 begins at activity 705 with forming a first polymer layer 805, such as a non-photosensitive polyimide layer, on a carrier substrate 801. Herein, the carrier substrate 801 includes a structural base 800, such as a rectangular panel formed of a rigid material such as silicon, glass, or a rigid polymer, and having a release layer 802, such as a thermal release layer, such as a tape or a thin film, disposed thereon. The first polymer layer 805 herein is formed by any suitable method such as spin coating or by dispensing droplets of the polymer onto the surface of the substrate. In some embodiments, the first polymer layer 805 is formed directly on the structural base 800.

The method 700 continues at activity 710 with imprinting a pattern into the first polymer layer 805 using an MIL process described herein to form a plurality of openings in the first polymer layer 805. In some embodiments, the MIL stamp is heated to above the glass transition temperature of the polymer, such as more than about 340° C. for a polyimide. In some embodiments, imprinting a pattern into the first polymer layer 805 takes place in a low pressure atmosphere environment, such as less than atmospheric pressure, less than about one half atmospheric pressure, or less than about 400 Torr, such as less than about 300 Torr.

The method 700 continues at activity 715 with depositing a seed layer (not shown in FIG. 8) over the first polymer layer 805 to enable the subsequent formation of a copper layer on the seed layer using an electroplating process at activity 720.

The method 700 continues at activity 725 with planarizing the surface of the substrate using a CMP and/or grinding process to remove the copper layer and portions of the seed layer therefrom which forms a first redistribution layer 810 comprising the first polymer layer 805 and a plurality of metal interconnects 812 disposed therein. Herein, activity's 705 to 725 are repeated until a desired number of redistribution layers are formed.

Once a desired number of redistribution layers are formed the method continues at activity 730 with bonding a plurality of singular devices 804 to metal contact pads of the metal interconnects 812 of the last formed redistribution layer 816.

The method ends at activity 735 with dispensing and curing a molding compound 815 over the plurality of singular devices to form a reconstituted substrate 814 before debonding the reconstituted substrate 814, and the redistribution layers disposed thereon, from the carrier substrate 801.

The method 700 allows for low cost and high throughput formation of redistribution layers in a panel fan-out packaging scheme.

While the foregoing is directed to embodiments of the present disclosure, other and further embodiments of the disclosure may be devised without departing from the basic scope thereof, and the scope thereof is determined by the claims that follow.

The invention claimed is:

1. A method for forming a redistribution layer, comprising:
   depositing a polymer precursor onto a surface of a substrate, the substrate comprising:
     a plurality of devices disposed in a molding compound to form a reconstituted substrate;
     a first polymer layer disposed on the reconstituted substrate, the first polymer layer having a plurality of openings formed therethrough to expose a corresponding plurality of contact pads of each of the devices; and
     a plurality of copper pillars respectively disposed in the plurality of openings, wherein a ratio of a height to a width of each of the copper pillars is more than about 2:1, and wherein at least a portion of each of the copper pillars extends above a surface of the first polymer layer;
   heating the polymer precursor to form a second polymer layer;
   heating an imprint stamp to above the glass transition temperature of the second polymer layer;
   imprinting a pattern into the second polymer layer using the heated imprint stamp to form a plurality of openings therein; and heating the second polymer layer to between about 250° C. and about 400° C. after imprinting the pattern.

2. The method of claim 1, wherein the polymer precursor comprises a polyimide precursor.

3. The method of claim 2, wherein imprinting the pattern into the second polymer layer comprises heating the imprint stamp to more than about 340° C.

4. The method of claim 3, wherein imprinting the pattern into the second polymer layer takes place in an environment at less than about atmospheric pressure.

5. The method of claim 1, wherein the first polymer layer comprises a polyimide.

6. A packaging method, comprising:
    forming a polymer layer on a first surface of a carrier substrate, the carrier substrate comprising a structural base and a release layer disposed on the structural base, wherein the polymer layer is temporarily secured to the structural base by the release layer;
    heating an imprint stamp to more than about 340° C.;
    imprinting a pattern into the polymer layer to form a plurality of openings therethrough using the heated imprint stamp; and
    forming a plurality of metal interconnects in the polymer layer comprising:
        depositing a seed layer onto the carrier substrate and the polymer layer formed thereon;
        forming a copper layer on the seed layer; and
        removing portions of the seed layer and the copper layer from a surface of the polymer layer.

7. The method of claim 6, wherein forming the polymer layer comprises depositing a polyimide precursor comprising one or more solvents onto the release layer and heating the polyimide precursor to between about 120° C. and about 150° C. to remove only a portion of the one or more solvents therefrom.

8. The method of claim 7, further comprising heating the polymer layer to between about 250° C. and about 400° C. after imprinting the pattern.

9. The method of claim 7, wherein the structural base comprises glass or a rigid polymer.

10. The method of claim 7, wherein imprinting the pattern into the polymer layer takes place in an environment maintained at less than atmospheric pressure.

11. A packaging method, comprising:
    dispensing a polyimide precursor onto a surface of a substrate, wherein the substrate comprises:
        a plurality of devices each including an active portion having a metal layer and a passivation layer disposed on the metal layer;
        a first polymer layer disposed on the passivation layer, the first polymer layer and the passivation layer having a plurality of openings formed therethrough to expose a corresponding plurality of contact pads on the metal layer; and
        a plurality of copper pillars respectively disposed in the plurality of openings, wherein a ratio of a height to a width of each of the copper pillars is more than about 2:1, and wherein at least a portion of each of the copper pillars extends above a surface of the first polymer layer;
    heating the polyimide precursor to between about 120° C. and about 150° C. to form a second polymer layer;
    heating an imprint stamp to above the glass transition temperature of the second polymer layer;
    imprinting a pattern into the second polymer layer using the heated imprint stamp to form a plurality of openings therein; and
    heating the second polymer layer to between about 250° C. and about 400° C. after imprinting the pattern.

12. The packaging method of claim 11, further comprising forming a plurality of metal interconnects in the second polymer layer.

13. The packaging method of claim 12, wherein forming the plurality of metal interconnects in the second polymer layer comprises:
    depositing a seed layer onto the patterned second polymer layer;
    forming a copper layer on the seed layer; and
    removing portions of the seed layer and the copper layer from a surface of the second polymer layer.

* * * * *

UNITED STATES PATENT AND TRADEMARK OFFICE
CERTIFICATE OF CORRECTION

PATENT NO. : 10,229,827 B2
APPLICATION NO. : 15/844989
DATED : March 12, 2019
INVENTOR(S) : Han-Wen Chen et al.

Page 1 of 1

It is certified that error appears in the above-identified patent and that said Letters Patent is hereby corrected as shown below:

In the Claims

In Column 9, Line 14, in Claim 6, after "on a" delete "first".

Signed and Sealed this
Seventh Day of May, 2019

Andrei Iancu
*Director of the United States Patent and Trademark Office*